US008042258B2

(12) United States Patent
Sennyu et al.

(10) Patent No.: US 8,042,258 B2
(45) Date of Patent: Oct. 25, 2011

(54) METHOD FOR PRODUCING SUPERCONDUCTING ACCELERATION CAVITY

(75) Inventors: Katsuya Sennyu, Kobe (JP); Koichi Okubo, Kobe (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 1114 days.

(21) Appl. No.: 11/660,731

(22) PCT Filed: Apr. 10, 2006

(86) PCT No.: PCT/JP2006/307535
§ 371 (c)(1),
(2), (4) Date: Jul. 30, 2007

(87) PCT Pub. No.: WO2006/109761
PCT Pub. Date: Oct. 19, 2006

(65) Prior Publication Data

US 2007/0275860 A1 Nov. 29, 2007

(30) Foreign Application Priority Data

Apr. 12, 2005 (JP) ................................ 2005-114127
Mar. 8, 2006 (JP) ................................ 2006-062089

(51) Int. Cl.
*H01L 39/24* (2006.01)

(52) U.S. Cl. .................... 29/599; 29/600; 72/82; 72/83; 72/478

(58) Field of Classification Search .................... 29/500, 29/600; 72/82, 83, 478
See application file for complete search history.

(56) References Cited

U.S. PATENT DOCUMENTS

| | | | | |
|---|---|---|---|---|
| 3,514,662 | A * | 5/1970 | Eldredge | 315/3.5 |
| 4,765,055 | A * | 8/1988 | Ozaki et al. | 29/599 |
| 5,097,689 | A * | 3/1992 | Pietrobon | 72/58 |
| 5,239,157 | A * | 8/1993 | Sakano et al. | 219/121.64 |
| 5,347,242 | A * | 9/1994 | Shimano et al. | 333/99 S |
| 5,500,995 | A * | 3/1996 | Palmieri et al. | 29/599 |

FOREIGN PATENT DOCUMENTS

| | | | |
|---|---|---|---|
| JP | 1-231300 | A | 9/1989 |
| JP | 2-159101 | A | 6/1990 |
| JP | 6-47567 | A | 2/1994 |
| JP | 7-30313 | A | 1/1995 |
| JP | 7-39965 | A | 2/1995 |
| JP | 2002-331318 | A | 11/2002 |
| JP | 2004-160542 | A | 6/2004 |

OTHER PUBLICATIONS

W. Singer, DESY, "Advanced Fabrication Methods of Superconducting RF Cavities" W.Singer, WG5-Asia meeting, KEK, Jan. 27, 2006.
V. Palmieri, "Spinning of Tesla-Type Cavities: Status of Art" 9th Workshop on RF Superconductivity, 1999, Istituto Nazionale di Fisica Necleare, pp. 532-537.

* cited by examiner

*Primary Examiner* — Carl Arbes
(74) *Attorney, Agent, or Firm* — Birch, Stewart, Kolasch & Birch, LLP

(57) ABSTRACT

A method for producing a superconducting acceleration cavity having a stabilized quality, by which production cost is reduced by reducing the number of welding points. A dumbbell-shaped dumbbell cell (3) is formed by forming a recessed iris portion (3*b*) around the central part of a cylindrical pipe made of a superconducting material, a cup-shaped half cell (2) is formed by enlarging one opening and reducing the other opening of the cylindrical pipe made of a superconducting material, a plurality of dumbbell cells (3) are coupled by welding, and the each half cell (2) is welded to the opposite ends of the plurality of dumbbell cell (3), thus producing a superconducting acceleration cavity (1).

2 Claims, 6 Drawing Sheets

METHOD FOR PRODUCING SUPERCONDUCTING ACCELERATION CAVITY

BACKGROUND OF THE INVENTION

1. Field of the Invention

This invention relates to a method for producing a superconducting acceleration cavity for use in a superconducting acceleration apparatus.

2. Description of the Related Art

A superconducting acceleration apparatus using a superconducting acceleration cavity comprising a superconducting material such as a niobium material has been developed as an apparatus for accelerating an electron beam or charged particles with a high efficiency. The superconducting acceleration apparatus is used in the field of elementary particle physics and the field of synchrotron radiation utilization facilities. As the fields of use of this apparatus expand, a demand is expected to grow for a superconducting acceleration apparatus high in efficiency, stable in quality and low in cost.

Patent Document 1: Japanese Unexamined Patent Publication No. 1990-159101

SUMMARY OF THE INVENTION

Problems to be Solved by the Invention

FIG. 5 shows the outline of a conventional superconducting acceleration cavity.

A conventional superconducting acceleration cavity 61 is formed by coupling and welding a plurality of half cells 62*a*, each comprising a cup-shaped tube enlarged at one opening and narrowed at the other opening, with the adjacent openings of the same size being opposed to each other. This superconducting acceleration cavity 61 is composed of a niobium material as a superconducting material. To construct a structure in which two of the half cells 62*a* are opposed to each other to form one cavity cell 62, and five of the cavity cells 62 are coupled together, for example, ten of the half cells 62*a* are used. As the welding points, a total of 11 sites are necessary, namely, 5 sites called equator portions including X2, X4, X6, X8 and X10, 4 sites called iris portions including X3, X5, X7 and X9, and 2 sites of welding to flange portions 63, including X1 and X11, as shown in FIG. 5. As noted here, many welds are required.

The superconducting acceleration cavity 61 is supplied with a predetermined high frequency power from a wave guide 64. Upon application of the supplied high frequency power, the cavity cells 62 resonate to form a predetermined acceleration gradient in their lengthwise direction. To obtain the desired acceleration gradient, the state of the cavity cell 62 (half cell 62*a*), for example, the state of the inner wall portion of the cavity, is important. If there is a surface defect or the like, it presents resistance to the high frequency wave, posing difficulty in obtaining the desired acceleration gradient. The same is true of the welded portion and, as the number of the welding points increases, it becomes more difficult to maintain the constant quality of the superconducting acceleration cavity 61. This has imposed limitation on the acceleration cavity, and has served as a factor of a cost increase.

There has been an attempt to integrally mold all the cells of the superconducting acceleration cavity. However, this has posed a problem such as cracking in the cavity surface, and has not been established as a realistic method of manufacturing. That is, in order to maintain the constant quality of the superconducting acceleration cavity, it is desired to minimize the number of the welding points.

Furthermore, not only the minimum number of the welding points, but an improvement in the edge preparation accuracy of the welding points is also desired for increasing the processing accuracy of the entire superconducting acceleration cavity.

The present invention has been accomplished in light of the above-described problems. It is an object of the invention to provide a method for producing a superconducting acceleration cavity having a stabilized quality, which reduces the manufacturing cost by decreasing the number of the welding points.

Means for Solving the Problems

A method for producing a superconducting acceleration cavity according to a first invention, for solving the above problems, is a method for producing a superconducting acceleration cavity, comprising:

forming a concavity around a central part of a cylindrical pipe made of a superconducting material to form a dumbbell-shaped first cavity;

enlarging one opening and narrowing another opening of the cylindrical pipe made of the superconducting material to form a cup-shaped second cavity; and welding a plurality of the first cavities for coupling, and welding the second cavities to opposite ends of the plurality of the first cavities.

A method for producing a superconducting acceleration cavity according to a second invention, for solving the above problems, is the method for producing a superconducting acceleration cavity according to the first invention, further comprising:

disposing the cylindrical pipe made of the superconducting material on an outer peripheral side of a columnar mold, the columnar mold having a concavity forming portion for forming the concavity of the first cavity and being divisible on a diametrical plane; and performing draw forming of the cylindrical pipe by use of another mold to be fitted into the concavity forming portion, thereby integrally molding the first cavity so as to follow the concavity forming portion.

A method for producing a superconducting acceleration cavity according to a third invention, for solving the above problems, is the method for producing a superconducting acceleration cavity according to the first invention, further comprising:

disposing the cylindrical pipe made of the superconducting material on an inner peripheral side of a tubular mold, the tubular mold having a convexity for forming the concavity of the first cavity and being divisible on an axial plane; and performing draw forming of the cylindrical pipe, thereby integrally molding the first cavity so as to follow a shape formed by the convexity.

A method for producing a superconducting acceleration cavity according to a fourth invention, for solving the above problems, is the method for producing a superconducting acceleration cavity according to the second or third invention, wherein the first cavity is processed into a final shape after having an intermediate shape.

A method for producing a superconducting acceleration cavity according to a fifth invention, for solving the above problems, is the method for producing a superconducting acceleration cavity according to the first invention, further comprising:

disposing the cylindrical pipe made of the superconducting material on an outer peripheral side of a columnar mold, the columnar mold having a concavity forming portion for forming the concavity of the first cavity and being divisible on a diametrical plane;

sealing opposite ends of the cylindrical pipe; and exerting pressure by a fluid from outside the cylindrical pipe, thereby integrally molding the first cavity so as to follow the concavity forming portion.

A method for producing a superconducting acceleration cavity according to a sixth invention, for solving the above problems, is the method for producing a superconducting acceleration cavity according to any one of the second to fourth inventions, further comprising:

providing ring-shaped detachable spacers at opposite end portions of the mold;

performing integral molding of the first cavity, with the spacers being mounted, during draw forming; and performing edge preparation of end portions of the first cavity, with the spacers being detached, during edge preparation of the first cavity.

Effects of the Invention

According to the present invention, the first cavity is rendered dumbbell-shaped by integral molding. Thus, the number of the welding points can be decreased, so that the manufacturing cost can be reduced. Furthermore, the decrease in the number of the welding points can stabilize the quality of the product when manufactured. That is, it becomes possible to produce a superconducting acceleration cavity of a superconducting acceleration apparatus of a low cost and having a high quality.

According to the present invention, the spacers are provided at opposite end portions of the mold. By so doing, the first cavity is formed into the shape of a dumbbell, with the spacers being mounted, during draw forming. Then, edge preparation of end portions of the first cavity is carried out, with only the spacers being detached, without detachment of the first cavity from the mold. Thus, the mold is shared between the draw forming and the edge preparation. Consequently, a changing operation can be omitted, and processing accuracy can be increased.

DESCRIPTION OF REFERENCE NUMERALS

1 superconducting acceleration cavity, 2 half cell, 3 dumbbell cell, 4 flange portion, 5 wave guide.

DETAILED DESCRIPTION OF THE INVENTION

A method for producing a superconducting acceleration cavity according to the present invention will be described by reference to FIG. 1 to FIGS. 4A, 4B.

Embodiment 1

Figure 1:
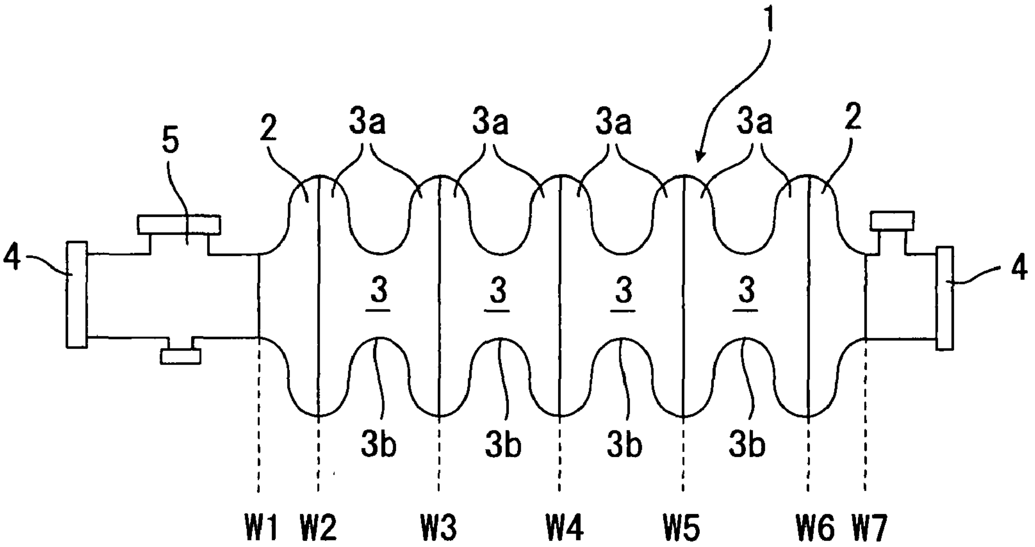
FIG. 1 is a schematic view showing an embodiment of a superconducting acceleration cavity according to the present invention.

FIG. 1 is a schematic view showing an embodiment of a superconducting acceleration cavity according to the present invention. A super conducting acceleration cavity 1 according to the present invention has dumbbell cells 3 (first cavities) and half cells 2 (second cavities), each dumbbell cell 3 comprising a dumbbell-shaped tube concaved in the surroundings of a central portion thereof, and each half cell 2 comprising a cup-shaped tube enlarged at one opening and narrowed at the other opening. The half cell 2 and the dumbbell cell 3 are both composed of a superconducting material such as a niobium material. In more detail, the superconducting acceleration cavity 1 according to the present invention is formed by coupling and welding a plurality of the dumbbell cells 3 in a longitudinal direction, opposing the openings of the half cells 2, which are same size as the openings of the dumbbell cells 3, to the openings of the opposite ends of the welded dumbbell cells 3 , and then welding the openings of the half cells 2 and the openings of the opposite ends of the welded dumbbell cell 3 each other.

If it is desired to construct a structure consisting of 5 cavity cells coupled together, for example, the superconducting acceleration cavity 1 is constructed using two of the half cells 2 and four of the dumbbell cells 3, because opposed increased-diameter portions 3*a* of the two dumbbell cells 3 are combined to form one cavity cell and the increased-diameter portion 3*a* of the dumbbell cell 3 and the half cell 2 are combined to form one cavity cell. The welding points are a total of 7 points including 3 points W3, W4 and W5 of welding between the dumbbell cells 3, 2 points W2 and W6 of welding between the half cell 2 and the dumbbell cell 3, and 2 points W1 and W7 of welding between the half cell 2 and a flange portion 4, as shown in FIG. 1. Thus, the number of the welding points can be reduced as compared with the conventional superconducting acceleration cavity. Welding is performed using an electron beam or a laser beam.

The superconducting acceleration cavity 1 is disposed within a jacket made of titanium (not shown), and is adapted to be cooled with liquid helium, which is supplied to the interior of the jacket to fill the surroundings of the superconducting acceleration cavity 1, so as to maintain a superconducting state. A wave guide 5, which supplies a predetermined high frequency power to the superconducting acceleration cavity 1, is provided in the vicinity of one end of the superconducting acceleration cavity 1. Under the action of the supplied high frequency power, the cavity cells resonate to form a predetermined acceleration gradient in a lengthwise direction of the superconducting acceleration cavity 1. An electron beam or charged particles passing through the interior of the superconducting acceleration cavity 1 are accelerated in the lengthwise direction of the superconducting acceleration cavity 1. One of the flange portions 4 is connected to a supply section for the electron beam or charged particles, and the other flange portion 4 is connected to a delivery section for the accelerated electron beam or charged particles. The size of the cavity cell becomes different according to the applied frequency. When a frequency of 1.3 GHz is applied, for example, the size of one cavity cell is about 200 mm in the diameter of the larger-diameter portion, 70 mm in the diameter of the smaller-diameter portion, and of the order of 115 mm in length. The niobium material constituting the cavity cell usually has a thickness of about 3 mm.

Here, methods of integrally molding the dumbbell cell 3 constituting the superconducting acceleration cavity 1 according to the present invention will be described using FIGS. 2A and 2B. In addition, some other molding methods will be described with reference to FIGS. 3A to 3D and FIGS. 4A and 4B. The integral molding methods described below are applicable when the half cell 2 is molded. In this case, a mold conformed to the shape of the half cell 2 is used.

The use of the integral molding methods described below can result in the molding of the dumbbell cell 3 free from a defect in the inner wall surface and of a stable shape, and can lead to stabilization of the quality of the dumbbell cell 3 itself. As a result, the number of the welding points can be reduced, thus contributing to the reduction of the manufacturing cost and the stabilization of the quality of the superconducting acceleration cavity 1.

Figure 2A:
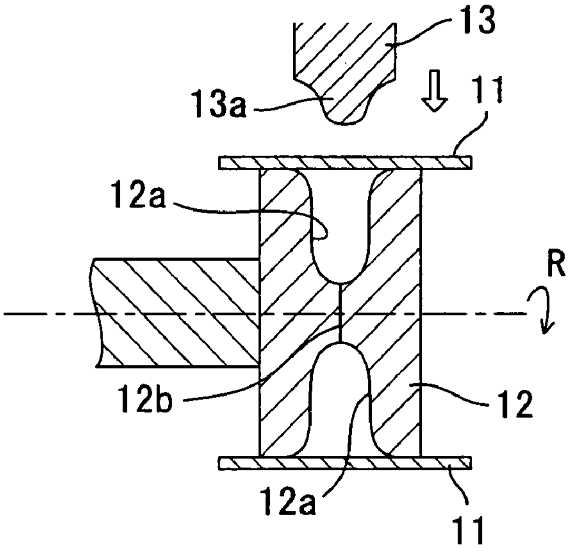
FIGS. 2A and 2B are sectional views each illustrating an example of a method for molding a dumbbell cell constituting the superconducting acceleration cavity according to the present invention.
Figure 2B:
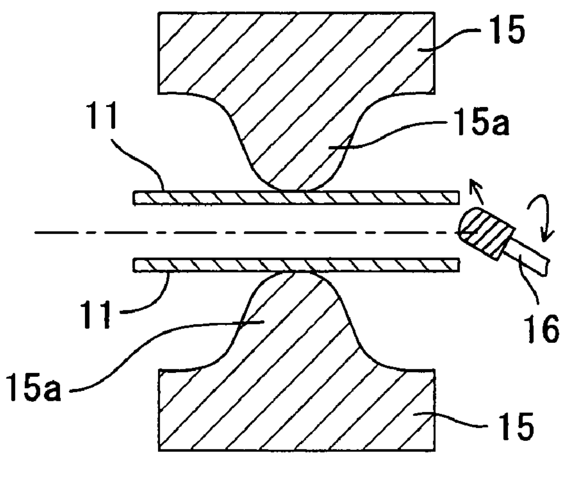

The methods of molding shown in FIGS. 2A and 2B are both called draw forming.

In the draw forming method shown in FIG. 2A, a cylindrical pipe member 11 comprising a niobium material is placed on the outer peripheral side of a columnar mold 12. The mold 12 is provided with a concavity 12*a* (concavity forming portion) recessed around a central portion thereof, and the concavity 12*a* contributes to the formation of an iris portion 3*b* of the dumbbell cell 3. Concretely, when the mold 12 is rotated, the pipe member 11 also rotates. A predetermined load is imposed on a central portion of the pipe member 11 from outside the pipe member 11 with the use of a spatula 13 having a convexity 13*a,* which fits in the concavity 12*a* with a predetermined clearance, to press the center portion of the pipe member 11 in the concavity 12, thereby forming the iris portion 3*b* of the dumbbell cell 3. The mold 12 itself can be divided into two, at a parting portion 12*b,* on a diametrical plane. After the formation of the dumbbell cell 3, the mold 12 is divided, and the dumbbell cell 3 after formation is withdrawn.

In the draw forming method shown in FIG. 2B, a cylindrical pipe member 11 comprising a niobium material is placed on the inner peripheral side of a tubular mold 15. The mold 15 is provided with a convexity 15*a* formed in a convex shape in the surroundings of a central portion of the inner wall surface thereof, and the concavity 15*a* contributes to the formation of an iris portion 3*b* of the dumbbell cell 3. Concretely, a predetermined load is imposed on an end portion of the pipe member 11 from inside the pipe member 11 with the use of a rod-shaped spatula 16 to widen the end portion of the pipe member 11 to a trumpet-shaped form, thereby forming the increased-diameter portion 3*a* of the dumbbell cell 3. As a result, the iris portion 3*b* is formed in the central portion of the pipe member 11. The mold 15 itself can be divided into two on an axial plane thereof. After the formation of the dumbbell cell 3, the mold 15 is divided, and the dumbbell cell 3 after formation is withdrawn.

Embodiment 2

The molding method shown in FIGS. 3A to 3D is called deep draw forming. According to this method, two types of female dies 22 and 26, and male dies 25 and 27 of shapes corresponding to these female dies 22 and 26 are used, and steps in four stages are performed to form the dumbbell cell 3.

Figure 3A:
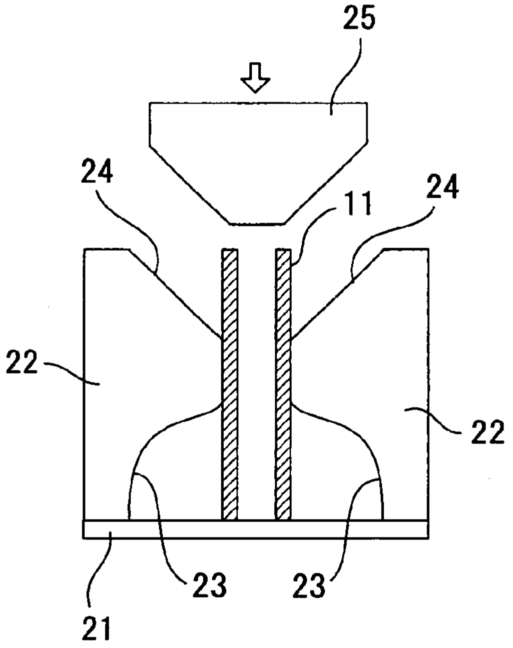
FIGS. 3A to 3D are sectional views illustrating another example of the method for molding the dumbbell cell constituting the superconducting acceleration cavity according to the present invention.

Concretely, in a first stage as shown in FIG. 3A, a cylindrical pipe member 11 comprising a niobium material is placed on a base plate 21, and the female die 22 of a tubular shape divisible into two on an axial plane is placed around the pipe member 11. The female die 22 has a curved portion 23 of a shape corresponding to the increased-diameter portion 3*a* on the lower side thereof, and an inclined portion 24 smaller in opening diameter than the curved portion 23 on the upper side thereof The leading end of the male die 25 to be fitted onto the inclined portion 24, with a predetermined clearance kept, is inserted into the inner diameter side of the pipe member 11 to impose a predetermined load and press in the male die 25, thereby forming one end portion of the pipe member 11 into a shape following the inclined portion 24, namely, an intermediate shape.

Figure 3B:
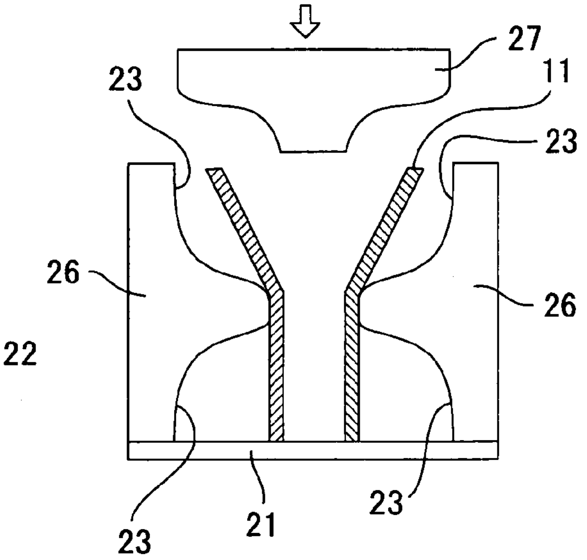

Then, in a second stage as shown in FIG. 3B, the female die surrounding the pipe member 11 having the one end portion formed in the intermediate shape is replaced by a tubular female die 26 divisible into two on an axial plane. The female die 26 has a curved portion 23 of a shape corresponding to the increased-diameter portion 3*a* on the lower side thereof, and also has a curved portion 23 of a shape corresponding to the increased-diameter portion 3*a* on the upper side thereof. The leading end of a male die 27 to be fitted onto the curved portion 23, with a predetermined clearance kept, is inserted into the inner diameter side of the pipe member 11 of the intermediate shape to impose a predetermined load and press in the male die 27, thereby forming the one end portion of the pipe member 11 of the intermediate shape into a shape following the curved portion 23, namely, the increased-diameter portion 3*a*.

Figure 3C:
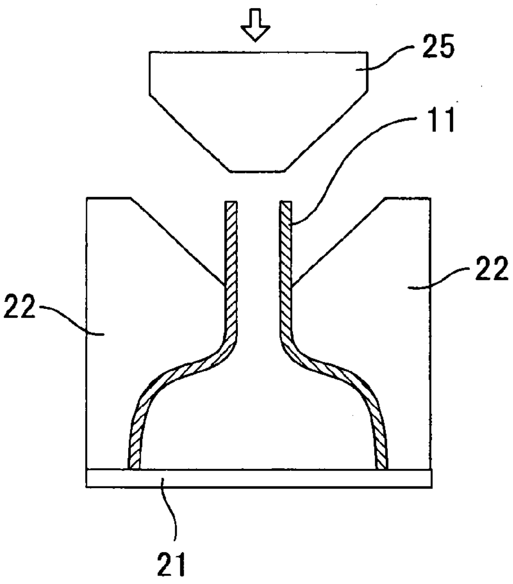

Then in a third stage as shown in FIG. 3C, the pipe member 11 having the increased-diameter portion 3*a*formed at the one end portion is turned upside down to point the one end portion downward, and the female die disposed around the one end portion is rendered the female die 22 again. The leading end of the male die 25 is inserted into the inner diameter side of the other end portion of the pipe member 11 to impose a predetermined load and press in the male die 25, thereby forming the other end portion of the pipe member 11 into an intermediate shape following the inclined portion 24.

Figure 3D:
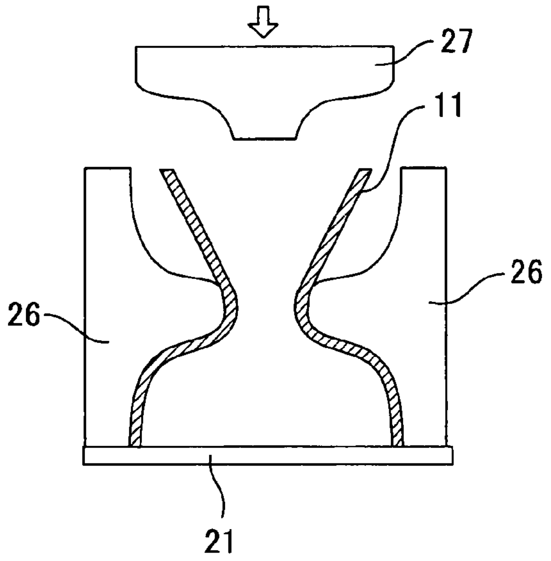

Finally, in a fourth stage as shown in FIG. 3D, the die around the pipe member 11 having the other end portion formed in the intermediate shape is rendered the female die 26 again. The leading end of the male die 27 is inserted into the inner diameter side of the pipe member 11 at the other end portion of the intermediate shape to impose a predetermined load and press in the male die 27, thereby forming the other end portion of the pipe member 11 of the intermediate shape into a shape following the curved portion 23, namely, the increased-diameter portion 3*a*. After formation of the dumbbell cell 3, the female die 26 is divided on the axial plane, and the dumbbell cell 3 after formation is withdrawn.

Embodiment 3

Figure 4A:
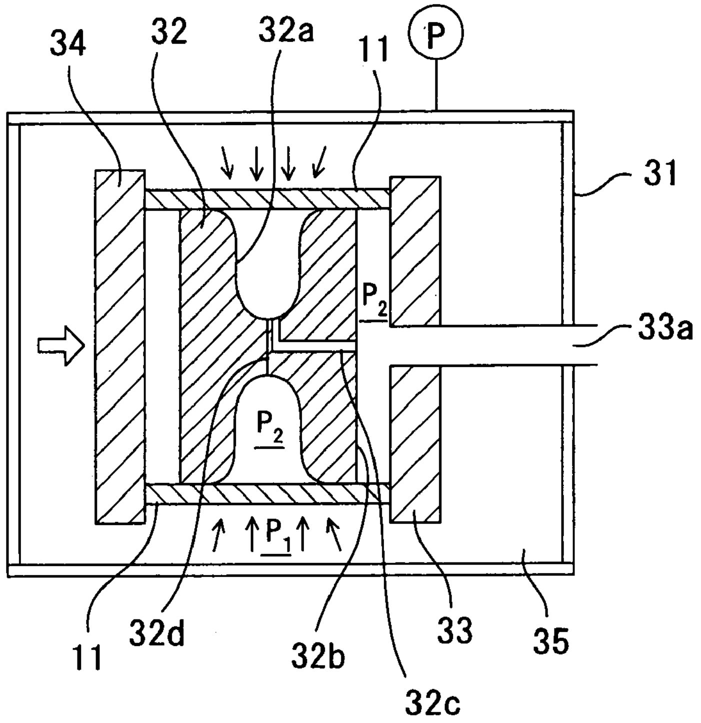
FIGS. 4A and 4B are sectional views each illustrating another example of the method for molding the dumbbell cell constituting the superconducting acceleration cavity according to the present invention.
Figure 4B:
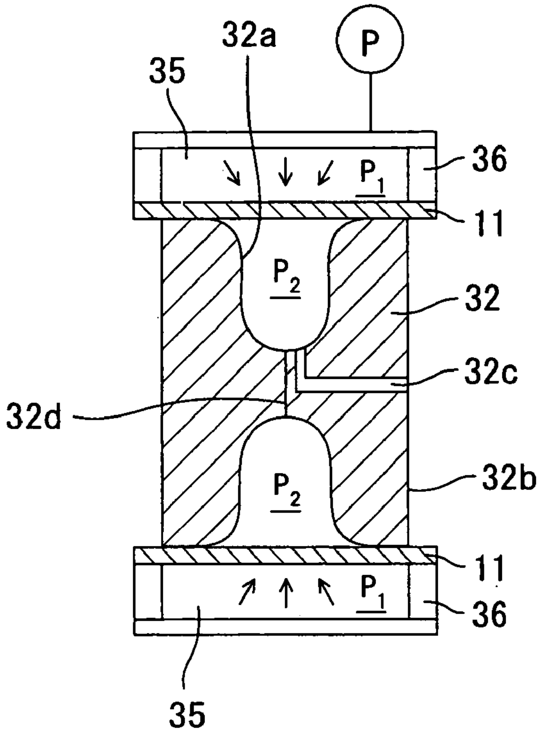
Figure 5:
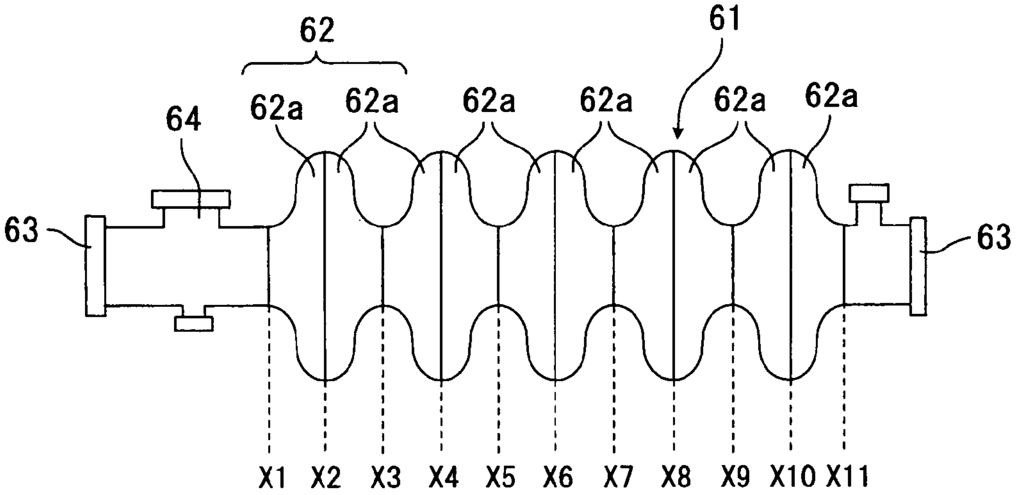
FIG. 5 is a schematic view showing a conventional superconducting acceleration cavity.

The molding methods shown in FIGS. 4A and 4B are called hydraulic forming, designed to deform an object by hydraulic pressure to impart a desired shape.

In the hydraulic forming method shown in FIG. 4A, a columnar mold 32 is placed within a pressure vessel 31, and a cylindrical pipe member 11 comprising a niobium material is placed on the outer peripheral side of the mold 32. The mold 32 is provided with a concavity 32*a* (concavity forming portion) recessed around a central portion of the mold 32, and the concavity 32*a* contributes to the formation of the iris portion 3*b* of the dumbbell cell 3. The mold 32 is also provided with a communication hole 32*c* for communication between the concavity 32*a* and one side end portion 32*b* so that during molding of the pipe member 11, a gas in a space defined by the concavity 32*a* and the pipe member 11 is discharged through the communication hole 32*c*. The pipe member 11 is sealed at its opposite end portions by sealing jigs 33 and 34 so that a pressure difference can be generated between the interior and the exterior of the pipe member 11.

Concretely, a liquid 35 (fluid) such as water or an oil is poured into the pressure vessel 31 to exert a predetermined pressure. As the pressure increases, the pipe member 11 is deformed by the pressure difference between the interior and the exterior of the pipe member 11, namely, the pressure difference between the pressure P1 of the liquid 35 and the pressure P2 of the residual gas within the pipe member 11. At this time, the sealing jigs 33, 34 apply predetermined axial tension to the pipe member 11 and, even when the pipe member 11 deforms, retain the sealing of the pipe member 11, and ensure the pressure difference between the interior and the exterior of the pipe member 11. Moreover, the gas discharged through the communication hole 32*c* is also let out of the pressure vessel 31 through a discharge pipe 33*a* provided in the sealing jig 33. This also contributes to the formation of the pressure difference between the interior and the exterior of the pipe member 11. In this manner, the liquid 35 within the pressure vessel 31 is controlled to the desired pressure, and the pipe member 11 is formed into the desired shape, i.e., the shape of the dumbbell cell 3, under the pressure of the liquid 35 applied from outside the pipe member 11. The mold 32 itself can be divided into two on the diametrical plane at a parting section 32*d*. After formation of the dumbbell cell 3, the mold 32 is divided, and the dumbbell cell 3 after formation is withdrawn.

The hydraulic forming method shown in FIG. 4B is different from the above-described hydraulic forming method of FIG. 4A in that the large pressure vessel 31 and the sealing jigs 33, 34 are unnecessary. Concretely, a mold 32 having a communication hole 32*c* is used as the mold, as in FIG. 4A. However, with respect to a pipe member 11 disposed on the outer peripheral side of the mold 32, a sealing vessel 36 is further disposed on the outer peripheral side of the pipe member 11. The sealing vessel 36 is pressed against, and contacted with, the outer peripheral surface of the pipe member 11 under a predetermined pressing force so that a liquid 35 poured into the sealing vessel 36 does not leak out even when pressurized.

Upon application of a predetermined pressure to the liquid 35 within the sealing vessel 36, the pressure difference arises between the interior and the exterior of the pipe member 11, as the pressure increases. Because of the pressure difference between the pressure P1 of the liquid 35 and the pressure P2 of the residual gas within the pipe member 11, the pipe member 11 deforms. At this time, the residual gas within the pipe member 11 is discharged to the outside through the communication hole 32*c* to ensure the pressure difference between the interior and the exterior of the pipe member 11. In this manner, the liquid 35 within the sealing vessel 36 is controlled to the desired pressure, and the pipe member 11 is formed into the desired shape, i.e., the shape of the dumbbell cell 3, under the pressure of the liquid 35 applied from outside the pipe member 11. After formation of the dumbbell cell 3, the mold 32 is divided into two at a parting section 32*d*, and the dumbbell cell 3 after formation is withdrawn.

According to the hydraulic forming described above, the pressure of the liquid is used as an external pressure, so that the force acting on the pipe member 11 becomes equal in all regions. Consequently, the dumbbell cell 3 free from a defect in the inner wall surface and of a stable shape can be molded.

Embodiment 4

Figure 6A:
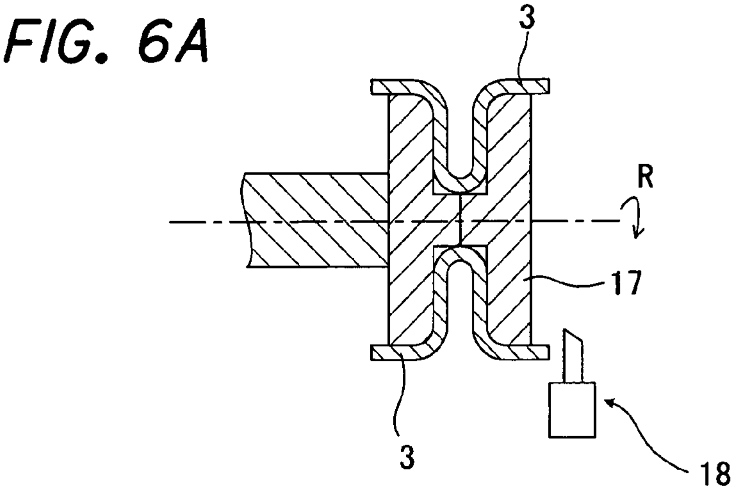
FIGS. 6A to 6C are sectional views each illustrating another example of the method for molding the dumbbell cell constituting the superconducting acceleration cavity according to the present invention.

The dumbbell cells 3 formed by the molding methods of Embodiment 1 and Embodiment 2 need to be subjected to edge preparation for welding after draw forming. With the conventional molding method, after draw forming, edge preparation has been carried out separately using an edge preparation device, as shown in FIG. 6A. That is, the dumbbell cell 3 is installed at a jig 17 for the dumbbell cell 3, and centering of the dumbbell cell 3 is performed. Then, edge preparation is performed using a processing tool 18. However, the jig 17 is constructed in smaller dimensions than those of the aforementioned mold 12 or the like for the purpose of installation of the dumbbell cell 17. Furthermore, the dumbbell cell 3 itself is not simple in shape. Thus, even if centering of the dumbbell cell 3 is performed, it is difficult to confirm whether the centering has been performed correctly. This has posed the risk of performing edge preparation in the presence of eccentricity.

Figure 6B:
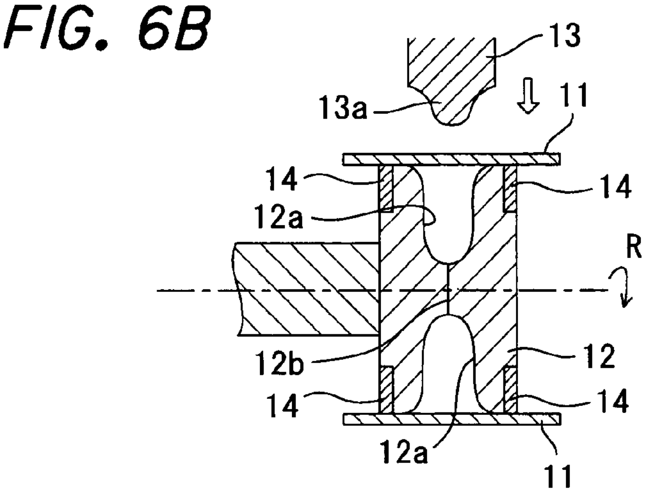
Figure 6C:
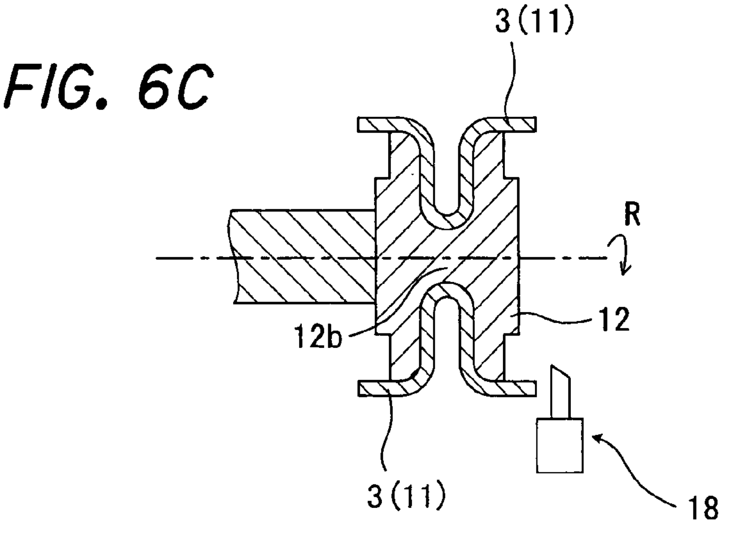

In the present embodiment, therefore, the mold 12 or the like is configured such that the dumbbell cell 3 after draw forming can be subjected to edge preparation while being installed at the mold 12 for draw forming. Concretely, as shown in FIGS. 6B, 6C, ring-shaped detachable spacers 14 are provided at opposite end portions of the mold 12. During draw forming, the spacers 14 are mounted on the mold 12 and, in this state, draw forming of the pipe member 11 is performed. After draw forming, only the spacers 14 are detached from the opposite end portions of the mold 12, and end portions of the dumbbell cell 3 at the sites of detachment of the spacers 14 are subjected to edge preparation using the processing tool 18. That is, draw forming and edge preparation both involve processing during rotation. Thus, if the mold is shared between both these methods, the operation for removing and remounting the dumbbell cell 3 can be omitted per se. Hence, the necessity for installing the dumbbell cell 3 again at other jig 17, as shown in FIG. 6A, is obviated, and dimensional accuracy during edge preparation can be increased.

The draw forming in FIG. 6B is comparable to the draw forming in FIG. 2A for Embodiment 1, and thus its detailed description is omitted here. Furthermore, the mold 15 in FIG. 2B for Embodiment 1 and the die 26 shown in FIGS. 3B and 3D for Embodiment 2 may be provided with members comparable to the spacer 14, whereby edge preparation comparable to that in the present embodiment can be performed.

INDUSTRIAL APPLICABILITY

The present invention is suitable for a superconducting acceleration cavity comprising a niobium material, but can also be applied in a case where a material other than a niobium material is used as the superconducting material.

The invention claimed is:

1. A method for producing a superconducting acceleration cavity, comprising:

forming a concavity around a central part of a cylindrical pipe made of a superconducting material to form a dumbbell-shaped first cavity, by placing the cylindrical pipe on an outer peripheral side of a columnar mold, the columnar mold having a concavity forming portion for forming the concavity of the first cavity and being divisible on a diametrical plane, the columnar mold also having ring-shaped detachable spacers provided at opposite end portions thereof, and performing draw forming of the cylindrical pipe by use of another mold to be fitted into the concavity forming portion with the ring-shaped detachable spacers attached to the columnar mold, thereby integrally molding the first cavity so as to follow the concavity forming portion;

performing edge preparation of end portions of the first cavity with the ring-shaped detachable spacers detached from the columnar mold;

enlarging one opening and narrowing another opening of another cylindrical pipe made of the superconducting material to form a cup-shaped second cavity;

forming a plurality of the first cavities and two of the second cavities; and welding the plurality of the first cavities for coupling, and welding the second cavities to opposite ends of the plurality of the first cavities.

2. A method for producing a superconducting acceleration cavity, comprising:

providing a columnar mold having a concavity forming portion for forming the concavity of the first cavity and being divisible on a diametrical plane, the columnar mold also having ring-shaped detachable spacers provided at opposite end portions thereof;

providing another mold to be fitted into the concavity forming portion;

placing a cylindrical pipe made of a superconducting material on an outer peripheral side of the columnar mold;

forming a concavity around a central part of the cylindrical pipe to form a dumbbell-shaped first cavity by draw forming the cylindrical pipe by use of the another mold with the ring-shaped detachable spacers attached to the columnar mold, thereby integrally molding the first cavity so as to follow the concavity forming portion;

performing edge preparation of end portions of the first cavity with the ring-shaped detachable spacers detached from the columnar mold;

enlarging one opening and narrowing another opening of another cylindrical pipe made of the superconducting material to form a cup-shaped second cavity;

forming a plurality of the first cavities and two of the second cavities; and welding the plurality of the first cavities for coupling, and welding the second cavities to opposite ends of the plurality of the first cavities.

* * * * *